(12) United States Patent
Matsumoto et al.

(10) Patent No.: US 7,091,609 B2
(45) Date of Patent: Aug. 15, 2006

(54) SEMICONDUCTOR DEVICES INCLUDING AN ALLOY LAYER AND A WETTING LAYER ON AN INTERLAYER DIELECTRIC

(75) Inventors: Kazuki Matsumoto, Chino (JP); Yukio Morozumi, Chino (JP); Michio Asahina, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/795,502

(22) Filed: Mar. 8, 2004

(65) Prior Publication Data

US 2004/0169274 A1 Sep. 2, 2004

Related U.S. Application Data

(62) Division of application No. 09/817,935, filed on Mar. 27, 2001, now Pat. No. 6,723,628.

(30) Foreign Application Priority Data

Mar. 27, 2000 (JP) .............................. 2000-86608

(51) Int. Cl.
*H01L 23/48* (2006.01)
*H01L 23/52* (2006.01)

(52) U.S. Cl. .................... 257/753; 257/761; 257/764; 257/765; 257/784

(58) Field of Classification Search ................ 257/758, 257/753, 761, 763, 771, 765, 750; 228/180.5; 438/612, 614, 652, 654, 688
See application file for complete search history.

(56) References Cited

U.S. PATENT DOCUMENTS

| | | | | |
|---|---|---|---|---|
| 5,539,256 A * | 7/1996 | Mikagi | ........................ | 257/763 |
| 6,100,182 A * | 8/2000 | Lee et al. | .................... | 438/637 |
| 6,265,300 B1 * | 7/2001 | Bhansali et al. | ............ | 438/612 |
| 6,300,237 B1 * | 10/2001 | Suzuki et al. | ................ | 438/623 |
| 6,307,267 B1 * | 10/2001 | Wada et al. | ................. | 257/761 |
| 6,614,119 B1 * | 9/2003 | Asahina et al. | ............. | 257/758 |

FOREIGN PATENT DOCUMENTS

JP 59172745 A * 9/1984

OTHER PUBLICATIONS

Kishimoto et al., "Semiconductor Device and Electrode Formation Thereof," English Translation of JP 59-172745 A, Sep. 1984.*

* cited by examiner

*Primary Examiner*—Stephen W. Smoot
(74) *Attorney, Agent, or Firm*—Konrad Raynes & Victor, LLP; Alan S. Raynes

(57) ABSTRACT

Certain embodiments of the present invention relate to a semiconductor device that has a pad section having an excellent coherency with an interlayer dielectric layer, and a method for manufacturing the same. A semiconductor device 1000 has a pad layer 30A formed over an interlayer dielectric layer 20. The pad section 30A includes a wetting layer 32 and a metal wiring layer 37. The metal wiring layer 37 includes an alloy layer 34 that contacts the wetting layer 32. The alloy layer 34 is formed from a material composing the wetting layer 32 and a material composing the metal wiring layer 37.

17 Claims, 4 Drawing Sheets ic devices having a characteristic structure of pad
SEMICONDUCTOR DEVICES INCLUDING AN ALLOY LAYER AND A WETTING LAYER ON AN INTERLAYER DIELECTRIC This is a Divisional of U.S. Pat. No. 6,723,628, filed Mar. 27, 2001, which is hereby incorporated by reference in its entirety. Japanese Patent Application No. 2000-086608, filed Mar. 27, 2000, is hereby incorporated by reference in its entirety. U.S. Pat. No. 6,812,123, filed Mar. 27, 2001, is hereby incorporated by reference in its entirety.

TECHNICAL FIELD

The present invention relates to semiconductor devices and methods for manufacturing the same, including semiconductor devices having a characteristic structure of pad sections (external connection electrodes) and methods for manufacturing the same.

RELATED ART

FIG. 4 shows a cross-sectional view of one example of a conventional bonding pad section. In this example, a pad section 130 is formed in a specified region over an uppermost interlayer dielectric layer 120 that is formed from a PBSG. The pad section 130 is formed from a titanium layer 132, a titanium nitride layer 134 and an aluminum alloy layer 136. A passivation layer 140 is formed over surfaces of the interlayer dielectric layer 120 and the pad section 130. An opening section 142 that forms a bonding region is formed in the passivation layer 140. Wire bonding with, for example, a wire 150 is conducted in the opening section 142.

The bonding pad structure can be formed in the same steps that are conducted to form the first wiring layer. More particularly, the uppermost interlayer dielectric layer 120 is formed in the same step that is conducted to form a first interlayer dielectric layer. The titanium layer 132 and the titanium nitride layer 134 that compose the pad section 130 are formed in the same steps that are conducted to form a barrier layer formed between an impurity diffusion layer formed in the semiconductor substrate and a contact section formed in the first interlayer dielectric layer. Further, the aluminum alloy layer 136 is formed in the same step that is conducted to form the contact section and the first wiring layer.

PROBLEMS WITH THE RELATED ART

In the bonding pad structure shown in FIG. 4, when the bonding wire 150 is bonded to the pad section 130, an exfoliation may occur near the interface between the pad section 130 and the interlayer dielectric layer 120. This type of exfoliation is thought to take place because a weak layer such as a titanium oxide layer is formed near the interface between the titanium layer 132 and the interlayer dielectric layer 120 and thus the coherency between the interlayer dielectric layer 120 and the titanium layer 132 lowers.

SUMMARY

One embodiment relates to a semiconductor device including a pad section over an interlayer dielectric layer, wherein the pad section includes a wetting layer and a metal wiring layer. In addition, the metal wiring layer includes an alloy layer that contacts the wetting layer, the alloy layer including a material that forms the wetting layer and a material that forms the metal wiring layer.

Another embodiment relates to a method for manufacturing a semiconductor device, comprising the steps of: (a) forming a interlayer dielectric layer; (b) forming a wetting layer over the interlayer dielectric layer; (c) forming at least a portion of a metal wiring layer over the wetting layer at a temperature of 350° C. or higher, and forming an alloy layer including a material comprising the wetting layer and a material comprising the metal wiring layer; and (d) forming a pad section by patterning the wetting layer and the metal wiring layer.

Another embodiment relates to a method for manufacturing a semiconductor device including a pad section, including providing a interlayer dielectric layer by forming three silicon oxide layers. The method also includes depositing a wetting layer consisting essentially of a first material selected from the group consisting of titanium, cobalt, zirconium, silicon and niobium. A first layer is deposited over the wetting layer, the first layer comprising a second material including aluminum deposited at a temperature of no greater than 200° C. A second layer is deposited over the first layer, the second layer comprising the second material deposited at a temperature of no less than 350° C.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
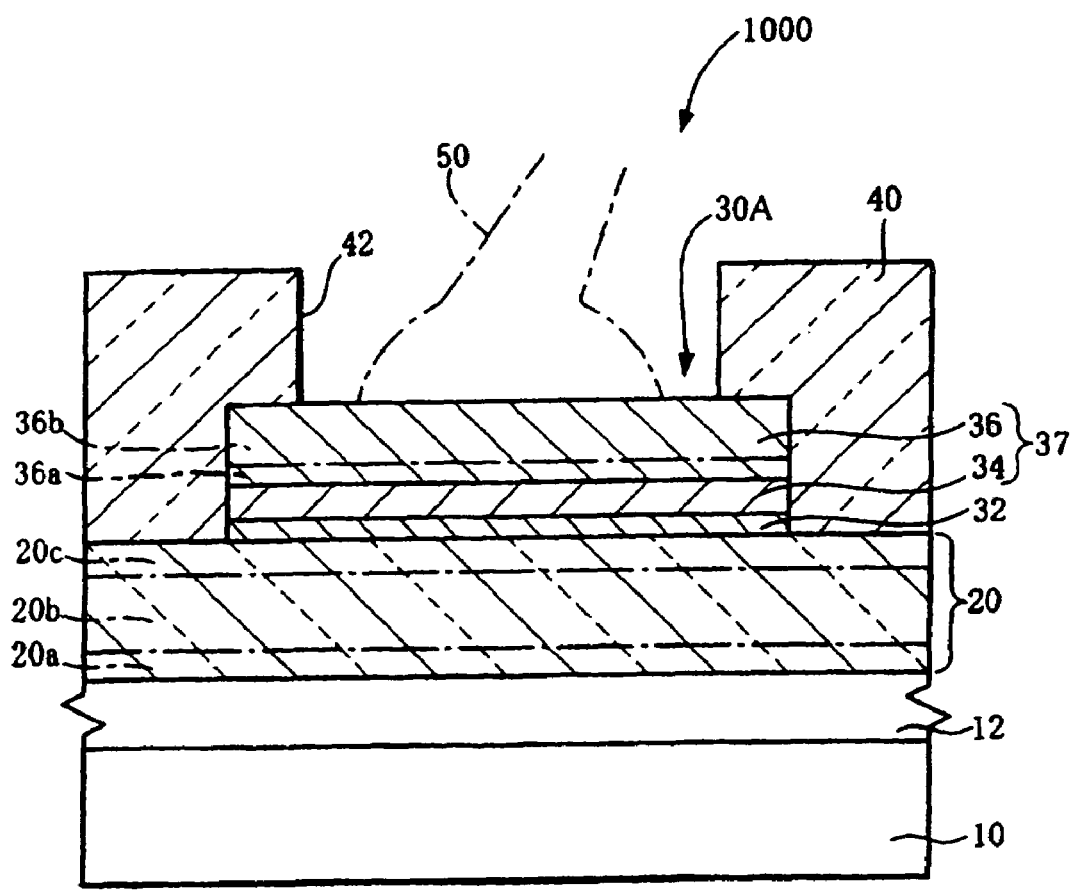
FIG. 1 schematically shows a cross-sectional view of a semiconductor device in accordance with an embodiment of the present invention.

It is an object of certain embodiments of the present invention to provide semiconductor devices having a pad section having an excellent coherency with an interlayer dielectric layer and methods for manufacturing the same. A semiconductor device in accordance with one embodiment of the present invention comprises: a pad section over an interlayer dielectric layer, wherein the pad section includes a wetting layer and a metal wiring layer, and the metal wiring layer includes an alloy layer that contacts the wetting layer, the alloy layer including a material that forms the wetting layer and a material that forms the metal wiring layer.

In the semiconductor device embodiment described above, the pad section includes an alloy layer. As a result, the coherency between the interlayer dielectric layer and the pad section can be greatly improved, and therefore the occurrence of the problems such as exfoliation of the pad section during the bonding step can be inhibited or prevented. In other words, because of the presence of the alloy layer, the amount of a material composing the wetting layer that is supplied to the interlayer dielectric layer can be relatively reduced. This prevents the formation of a reaction material of the material composing the wetting layer and the material composing the interlayer dielectric layer, such as, for example, a weak layer of titanium oxide, and thus improves the coherency of the pad section with respect to the interlayer dielectric layer.

In the semiconductor device described above, one or more of the following aspects may preferably be provided. These aspects are likewise applicable to methods for manufacturing a semiconductor device.

(1) The alloy layer may preferably have a film thickness that is up to about two to three times greater than a film thickness of the wetting layer, in view of sufficiently reducing the amount of the material composing the wetting layer to be supplied to the interlayer dielectric layer. For example, when the wetting layer has a film thickness of 15–80 nm, the alloy layer has a film thickness of 15–240 nm.

(2) The pad section preferably does not include a barrier layer such as a nitride layer having a barrier function, for example, a titanium nitride layer between the wetting layer and the metal wiring layer. Because a nitride layer is preferably not present, the reaction between the material composing the wetting layer and the material composing the metal wiring layer is not hindered, and a reaction layer (the alloy layer) of the both layers can be readily formed.

A method for manufacturing a semiconductor device in accordance with certain embodiments of the present invention may include the following steps (a)–(d):

(a) forming a interlayer dielectric layer;

(b) forming a wetting layer over the interlayer dielectric layer;

(c) forming at least a portion of a metal wiring layer over the wetting layer at a temperature of 350° C. or higher, and forming an alloy layer including a material composing the wetting layer and a material composing the metal wiring layer; and (d) forming a pad section by patterning the wetting layer and the metal wiring layer.

By the method for manufacturing a semiconductor device, in step (c), an alloy layer including a material composing the wetting layer and a material composing the metal wiring layer is formed. As a result, the interlayer dielectric layer having an excellent coherency with respect to the wetting layer can be formed for the same reasons described above.

Furthermore, the following embodiment can be provided in the method for manufacturing a semiconductor device.

Before step (b), the degasification step may be conducted to remove degasification components included in the interlayer dielectric layer. By conducting the degasification step, generation of gases such as water, nitrogen, hydrogen or oxygen included in the interlayer dielectric layer can be suppressed in later steps, for example, in the step in which the second aluminum layer is formed under a high-temperature condition such as 350° C. or higher. It is noted that the interlayer dielectric layer is not limited to a specific type, and can be a chemical vapor deposition (CVD) layer formed using tetraethylorthosilicate (TEOS) as a silane compound, a multiple-layered structure having a CVD layer of TEOS, an SOG layer and a CVD layer of tetraethylorthosilicate, or the like.

It was confirmed that gases generated from the interlayer dielectric layer are absorbed in the wetting layer but not absorbed in the metal wiring layer (for example, aluminum layer). By removing gasification components included in the interlayer dielectric layer before film formation of the aluminum layer before step (b), a lowered wettability of the wetting layer and generation of voids, which would be caused by the presence of the gases between the wetting layer and the metal wiring layer, are securely suppressed. As a result, a metal wiring layer having a low resistance with a good coverage can be formed.

It is noted that the terms "gasification components" mean gas components such as water, hydrogen, oxygen and nitrogen that may be generated from deposited layers such as an interlayer dielectric layer or a wetting layer under a reduced pressure at substrate temperatures of 300° C. or higher. Also, the terms "reduced pressure" means an atmospheric pressure of 2.6 Pa or lower, and more preferably an atmospheric pressure of 1.3 Pa or lower.

Also, certain embodiments of the present invention include, after step (c), the step of lowering the substrate temperature to about 100° C. or below, and more preferably about room temperature to 50° C. By lowering the substrate temperature in this step, the temperature of the substrate can be sufficiently lowered before the metal wiring layer is formed. In the degasification step that is conducted before step (b), the substrate temperature is preferably elevated over 300° C. Therefore, by securely lowering the substrate temperature in this step, the temperature control in succeeding steps can be securely performed. Also, by conducting the step, the amount of gases discharged from the interlayer dielectric layer, the wetting layer and the entire surface of the wafer can be reduced to a minimum level when the metal wiring layer is formed. As a result, harmful gases having deteriorating effects on the coverage and cohesiveness, which are adsorbed in the interface between the wetting layer and the metal wiring layer, can be inhibited or prevented.

The metal wiring layer may preferably be provided by forming a first aluminum layer composed of aluminum or an alloy containing aluminum as a main component at a preferred temperature of 200° C. or below, and then forming a second aluminum layer composed of aluminum or an alloy containing aluminum as a main component at a temperature of about 350° C. or higher.

Further, when the first aluminum layer is formed over the wetting layer at temperatures of 200° C. or below, and more preferably at 30–100° C., gasification components included in the interlayer dielectric layer and the wetting layer can be suppressed from being gasified, and reduction of the wettability of the wetting layer, which may be caused by externally discharged gases from the wetting layer, is inhibited or prevented. As a result, the first aluminum layer can be bonded to the wetting layer with good coherency, and the formed film has good step coverage.

Due to the presence of the first aluminum layer, generation of gases from the interlayer dielectric layer and the wetting layer below the first aluminum layer can be suppressed. Accordingly, the second aluminum layer can be formed at relatively high temperatures. In other words, the second aluminum layer can be formed at high temperatures in which aluminum or an aluminum alloy can flow and diffuse, and the alloy layer can be formed with a specified film thickness, for example, at temperatures of 350° C. or higher, and more preferably at 420–460° C.

In this manner, by forming the first aluminum layer at relatively low temperatures and the second aluminum layer at relatively high temperatures, they can be embedded in a via hole without generating voids and with good step coverage.

The aluminum layers may preferably be formed by a sputtering method, and the first aluminum layer and the second aluminum layer may preferably be successively formed in the same chamber. By successively forming the first aluminum layers in the same chamber, the substrate temperature can be readily controlled, and problems such as formation of an oxide layer on the surface of the first aluminum layer or the like can be avoided. Furthermore, the substrate temperature is set by controlling the temperature of a stage on which the substrate is mounted.

Also, the cooling step and the step of forming the aluminum layers may preferably be successively conducted in the same apparatus having plural chambers that are maintained in a reduced pressure state.

As a result, the steps of moving and positioning substrates are reduced, and thus the manufacturing process is simplified and pollution of substrates can be inhibited or prevented.

The alloy containing aluminum as a main component may be an alloy including at least one component, two components or three or more components selected from copper, silicon, germanium, magnesium, cobalt and beryllium, for example.

The wetting layer may preferably be formed from a material selected from titanium, cobalt, zirconium, silicon and niobium.

Preferred embodiments of the present invention are described below with reference to the accompanying drawings.

Figure 2:
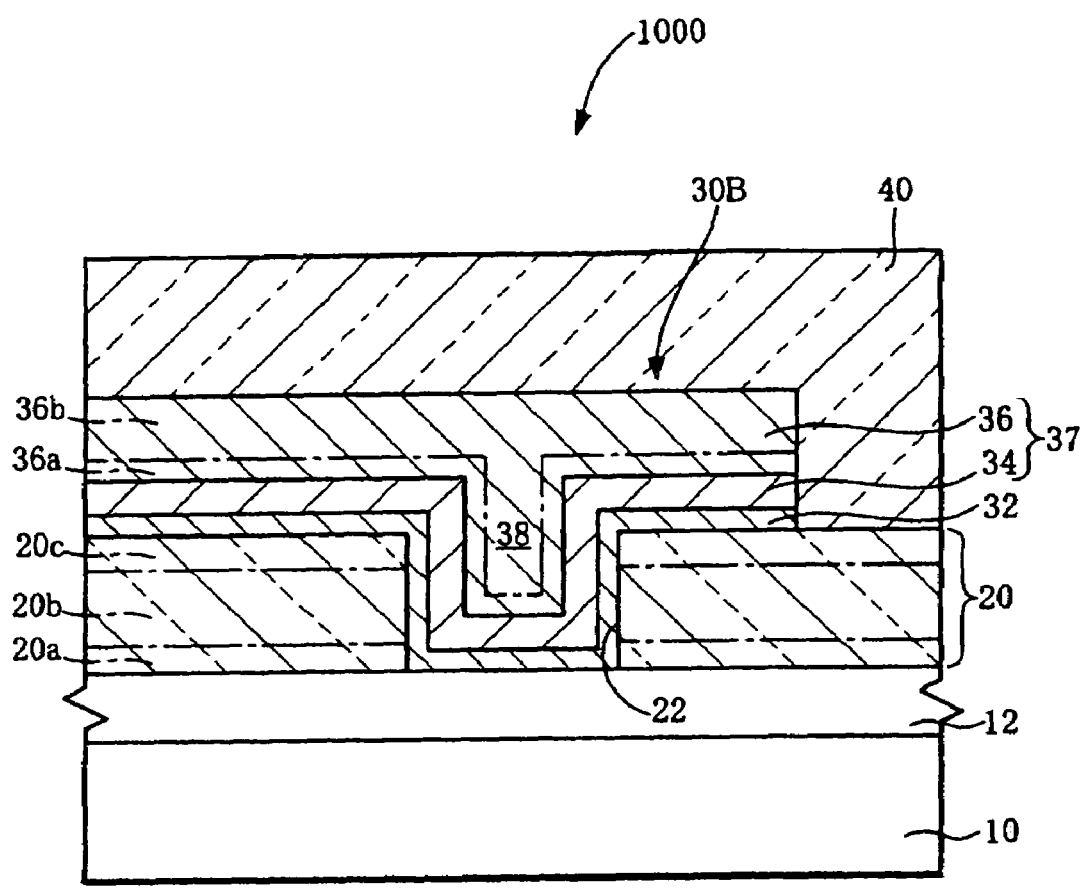
FIG. 2 schematically shows a cross-sectional view of a semiconductor device in accordance with an embodiment of the present invention.

FIGS. 1 and 2 schematically show cross-sectional views of a semiconductor device 1000 in accordance with an embodiment of the present invention. FIG. 1 shows a region where a pad section 30A is formed. FIG. 2 shows a wiring layer 30B that is formed in the same step in which the pad section 30A is formed.

As shown in FIGS. 1 and 2, the semiconductor device 1000 has an intermediate region 12 formed over a silicon substrate 10. An uppermost interlayer dielectric layer 20 is formed over the intermediate region 12. The pad section 30A and the wiring layer 30B are formed in specified regions over the uppermost interlayer dielectric layer 20. Furthermore, a passivation layer 40 is formed over surfaces of the interlayer dielectric layer 20, the pad section 30A and the wiring layer 30B.

Each of the layers is described below.

Semiconductor devices such as MOSFETs, bipolar transistors and the like, wiring layers and element isolation regions may be formed on or over surfaces of the silicon substrate 10.

The intermediate region 12 may have a known layered structure (not shown), that has one or more sets of an interlayer dielectric layer in which an interlayer contact layer such as a contact layer or a via-contact layer is formed and a dielectric layer in which a wiring layer is provided, formed over the silicon substrate 10 in which the semiconductor devices are formed.

Preferably, the present embodiment does not include a barrier layer (such as a nitride layer) typically required for a wiring layer in a first layer. Accordingly, the interlayer dielectric layer 20 and the pad section 30A may preferably be formed in the same steps in which layers above a second layer, and more preferably an uppermost interlayer dielectric layer and a wiring layer are formed.

The uppermost interlayer dielectric layer 20 may be formed from a variety of the silicon oxide layers described above. The interlayer dielectric layer 20 is formed from, for example, three silicon oxide layers, i.e., a first silicon oxide layer 20a, a second silicon oxide layer 20b and a third silicon oxide layer 20c in this order from the bottom. Preferred manufacturing methods for the respective layers are described below.

The first silicon oxide layer 20a is provided if needed and functions as a base layer. Therefore, the first silicon oxide layer 20a may preferably be formed with a relatively dense layer. The second silicon oxide layer 20b may preferably be formed from a layer having a good planarization. The third silicon oxide layer 20c functions as a cap layer.

The pad section 30A and the wiring layer 30B have the same layered structure. In other words, the pad section 30A and the wiring layer 30B have a wetting layer 32 and a metal wiring layer 37 in this order from the bottom. Moreover, the metal wiring layer 37 is formed from an alloy layer 34 and a metal layer 36.

The wetting layer 32 is preferably formed from at least one material selected from titanium, cobalt, zirconium, silicon and niobium. Due to the presence of the wetting layer 32, the wettability of a via hole 22 shown in FIG. 2 improves. As a result, a contact section 38 that is formed from a low resistance alloy layer 34 and a metal layer 36 can be formed in the via hole 22 with a good coverage. The contact section 38 electrically connects the wiring layer 30B and a wiring layer in a lower level (not shown) in a specified region.

The alloy layer 34 is formed form a material composing the wetting layer 32 and a material composing the metal layer 36. For example, when titanium is used for the wetting layer 32 and an aluminum layer (an aluminum layer or an aluminum alloy layer) is used as the metal wiring layer (the metal layer 36), the alloy layer 34 is mainly composed of a titanium-aluminum alloy. The alloy layer 34 is mainly formed when the metal layer 36 is formed by a high temperature sputtering. Therefore, the film thickness of the alloy layer 34 depends on the sputtering temperature, the thermal history over 350° C. until the process is completed, and the film thickness of the wetting layer 32. However, the film thickness of the alloy layer 34 may preferably be up to about two to three times greater than a film thickness of the wetting layer 32.

For example, when the wetting layer has a film thickness of 15–80 nm, the alloy layer has a film thickness of 15–240 nm.

Because the alloy layer 34 is formed between the wetting layer 32 and the metal layer 36, the amount of a material composing the wetting layer 32 that is supplied to the interlayer dielectric layer 20 can be relatively reduced. This lowers the amount of a reaction material generated from the wetting layer 32 and the interlayer dielectric layer 20, such as, for example, titanium oxide. As a result, this prevents the formation of a weak layer in proximity to an interface between the interlayer dielectric layer 20 and the wetting layer 32, which may cause exfoliation of the pad section 30A, and thus improves the coherency of the pad section 30A with respect to the interlayer dielectric layer 20.

An example of a method for manufacturing a semiconductor device in accordance with the present invention is described with reference to FIG. 1 and FIG. 2.

First, semiconductor devices such as MOSFETs, bipolar transistors and the like, wiring layers and element isolation regions (not shown) are formed on or over surfaces of a silicon substrate 10 by a know method.

Then, one or more sets of an interlayer dielectric layer in which an interlayer contact layer such as a contact layer or a via-contact layer is formed and a dielectric layer in which a wiring layer is provided are deposited in layers by a know method to form an intermediate region 12 over the silicon substrate 10 in which the semiconductor devices are formed An interlayer dielectric layer 20 may be formed from three silicon oxide layers, i.e., a first silicon oxide layer 20a, a second silicon oxide layer 20b and a third silicon oxide layer 20c in this order from the bottom.

First, the first silicon oxide layer 20a having a film thickness of 100–200 nm may be formed by reacting a silane compound such as monosilane, TEOS or the like and oxygen, ozone or a compound including oxygen such as $N_2O$ or the like through a plasma chemical vapor deposition (CVD) method at temperatures of 300–500° C.

The second silicon oxide layer 20b may then be formed by conducting a vapor phase reaction between a silane compound such as $SiH_4$, TEOS or the like, oxygen or ozone, and gas containing phosphorous and boron to form a BPSG layer (second silicon oxide layer) 20b having a film thickness of several hundred nm to 1 μm over the first silicon oxide layer 20a. Then, an anneal treatment may be conducted in a nitrogen atmosphere at temperatures of 800–900° C., to thereby conduct planarization by high temperature flow. Instead of conducting the high temperature flow of the BPSG layer 20b, a commonly employed SOG layer may be used to conduct planarization.

Then, the third silicon oxide layer 20c having a film thickness of 200–500 nm may be formed in a similar manner in which the first silicon oxide layer 20a is formed.

Next, the interlayer dielectric layer 20 may be planarized by polishing a specified amount of film thickness by a CMP method, as needed.

Then, the interlayer dielectric layer 20 may be selectively etched by, for example, an anisotropic etching method using a reactive ion etcher containing $CHF_3$ and $CF_4$ as main gases, to form a via hole 22 (see FIG. 2).

A heat treatment including a degasification process will be described below.

Lamp heating (heat treatment A) is preferably conducted in a lamp chamber under base pressures of $1.5 \times 10^{-4}$ Pa or lower, at temperatures of 150–350° C., and more preferably at temperatures of 150–250° C., for 30–60 seconds. Then, in another chamber where argon gas is introduced at pressures of $1 \times 10^{-1}$–$15 \times 10^{-1}$ Pa, a heat treatment (degasification step: heat treatment B) is conducted at temperatures of 150–550° C. for 30–300 seconds to thereby perform a degasification process.

In this process, first, the entire wafer including its rear surface and side surface may be heat treated in the heat treatment A to remove water content that adheres to the wafer, as a primary object.

Then, in the heat treatment B, mainly, gasification components (O, H, $H_2O$, N) in the interlayer dielectric layer 20 are removed. As a result, generation of gasification components from the interlayer dielectric layer 20 can be prevented during film formation of a wetting layer and an aluminum layer (metal wiring layer) that are conducted in later steps.

In accordance with an embodiment of the present invention, a wetting layer 32, for example, a Ti film may contain several tens atom % of gasification components (O, H, $H_2O$, N) in a solid solution. Accordingly, removal of the gasification components in the interlayer dielectric layer 20 before forming the wetting layer is very effective in successfully forming an aluminum layer in the via hole 22. Unless the gasification components are sufficiently removed from the interlayer dielectric layer 20 below the wetting layer, the gasification components in the interlayer dielectric layer 20 may be discharged and enter the wetting layer during formation of the wetting layer. Further, the gases are separated from the wetting layer when an aluminum layer is formed and come out into an interface between the wetting layer and the aluminum layer, causing deteriorating effects on cohesiveness and flowability of the aluminum layer.

Formation of a wetting layer may be conducted follows. For example, a titanium layer serving as the wetting layer 32 is formed to a preferred film thickness of 20–70 nm by a sputtering method. The sputtering is preferably conducted at temperatures of 100° C. or lower, and more preferably 25° C. or lower.

The method of forming the wetting layer 32 affects the embedding of the aluminum layer in the via hole 22 for the following reasons. A second aluminum layer 36b formed in the via hole 22 is formed by a sputtering method at preferred high temperatures of 420–460° C. If the wetting layer is thick in an upper portion of the via hole, a material composing the wetting layer and the aluminum may react to form a compound or an alloy thereof (for example, when the wetting layer is formed from titanium, an aluminum-titanium alloy is formed), such that the upper portion of the via hole is closed by the compound or the alloy, in other words, a pinch-off state is created. In the pinch-off state, flow of aluminum into the via hole is hindered during the film formation of the second aluminum layer, and voids may likely be generated in the aluminum layer.

To inhibit or prevent the generation of such voids, the wetting layer 32 may preferably be formed thickly in the bottom section of the via hole 22 and areas adjacent thereto, and thinly in other areas such as an upper end section and side wall section of the via hole 22. To form the wetting layer 32 having such a controlled film thickness, a collimator sputter method or a long-throw sputter method may preferably be employed. The inventors of the present application confirmed that a good quality aluminum layer can be formed without generating pinch-off or voids in a via hole having a diameter of 2 μm with an aspect ratio being 3 or greater (for example, 3–6) when the wetting layer is formed by these methods.

Before cooling the wafer, a heat treatment (heat treatment F) may be conducted in a lamp chamber under base pressures of $1 \times 10^{-4}$ Pa or lower at temperatures of 150–250° C. for 30–60 seconds to remove substances such as water adhered to the substrate.

Before an aluminum film is formed, the substrate temperature is preferably lowered to 100° C. or lower, and more preferably to about room temperature to 50° C. This cooling process is important to lower the temperature of the substrate that has been elevated when the wetting layer 32 is sputtered.

By cooling the wafer in the manner described above, the amount of gases which may be discharged from the interlayer dielectric layer 20, the wetting layer 32 and the entire surface of the wafer at the time of film formation of the first aluminum film 36a is reduced to a minimum. As a result, this inhibits or prevents deteriorating effects of the gases which may be adsorbed on the interface between the wetting layer 32 and the first aluminum layer 36a to damage their coverage and cohesiveness.

The cooling process may preferably be conducted commonly using a sputter apparatus having plural chambers with the same structure for forming an aluminum layer. For example, the substrate may be mounted on a stage having a cooling function within the sputter apparatus, and the temperature of the substrate may preferably be lowered to a specified temperature.

Film formation of a conductive layer such as aluminum may be conducted as follows. First, a first aluminum layer 36a is formed by sputtering aluminum containing 0.2–1.0 weight % copper at a high speed at temperatures of 200° C. or lower, and more preferably at 30–100° C. to a preferred film thickness of 150–300 nm. Then, the substrate temperature is elevated to 420–460° C. in the same chamber, and aluminum similarly containing copper is sputtered at a low speed to form a second aluminum layer 36b having a preferred film thickness of 300–600 nm. In this film formation step, the level of "high speed" for film formation of the aluminum layers may vary depending on the film forming condition and design specifications of a device to be manufactured. However, in this embodiment, the terms "high speed" refer to sputtering speeds of about 10 nm/second or faster, and the terms "low speed" refer to sputtering speeds of about 3 nm/second or slower.

Aluminum sputtering may preferably be performed in the sputter apparatus that is used to cool the wafer before the aluminum layer is formed. In this manner, the cooling process and the aluminum film forming process are conducted in the same apparatus. As a result, the number of steps required for moving and mounting substrates is reduced, and therefore the process is simplified and pollution of the substrates is prevented.

By successively forming the first aluminum layer 36a and the second aluminum layer 36b in the same chamber, the temperature and the power can be precisely controlled and stable aluminum layers are effectively formed at lower temperatures compared to the conventional technique.

The film thickness of the first aluminum layer 36a is selected to be in an appropriate range in view of the capability of forming successive layers with good step coverage and the capability of suppressing discharge of gasification components from the wetting layer 32 and the interlayer dielectric layer 20 below the aluminum layer 36a. For example, the film thickness may preferably be 200–400 nm. The film thickness of the second aluminum layer 36b may be determined by the size of the via hole 22 and its aspect ratio. For example, the film thickness of 300–1,000 nm is necessary to cover a via hole having a diameter of 0.5 μm or smaller with an aspect ratio of about 3.

Further, an antireflection layer having a film thickness of 30–80 nm may be formed by sputter-depositing TiN in another sputter chamber. Then, deposited layers having the wetting layer 32, the first aluminum layer 36a, the second aluminum layer 36b and the antireflection layer 37 are selectively etched, using an anisotropic dry etcher containing $Cl_2$ and $BCl_3$ gases as main components, to pattern the pad section 30A and the wiring layer 30B.

A passivation layer 40 may also be formed by a known method. Then, an opening section 42 is formed in the passivation layer 40 to expose a specified region of the pad section 30A.

Results of experiments conducted on the semiconductor devices in accordance with an embodiment of the present invention are described below. Samples used in the experiments were provided as follows:

(a) Sample in accordance with an embodiment of the present invention:

A silicon oxide layer as the interlayer dielectric layer 20, a titanium layer as the wetting layer 32 having a film thickness of 45 nm, and an aluminum layer as the metal wiring layer 37 having a film thickness of 550 nm were deposited in layers over a silicon substrate. The metal wiring layer 37 is composed of a first aluminum layer formed at a sputtering temperature of 100° C. and a second aluminum layer formed at a sputtering temperature of 460° C. The alloy layer 34 of the sample had a film thickness of about 100 nm.

The silicon oxide layer forming the interlayer dielectric layer 20 was a CVD layer formed by using TEOS and oxygen, having a film thickness of 900 nm.

(b) Comparison sample:

A comparison sample had a titanium nitride layer having a thickness of 100 nm between the wetting layer and the aluminum layer. It is confirmed that almost no alloy layer is formed in this sample.

Peeling strengths of the sample of the present embodiment and the comparison sample are observed by the following method.

(a) A pen with a diamond tip is dropped onto the surfaces of the samples from a specified height (2–3 cm).

(b) Adhesive tape is adhered to the surfaces of the samples, and then the adhesive tape is peeled.

Figure 3:
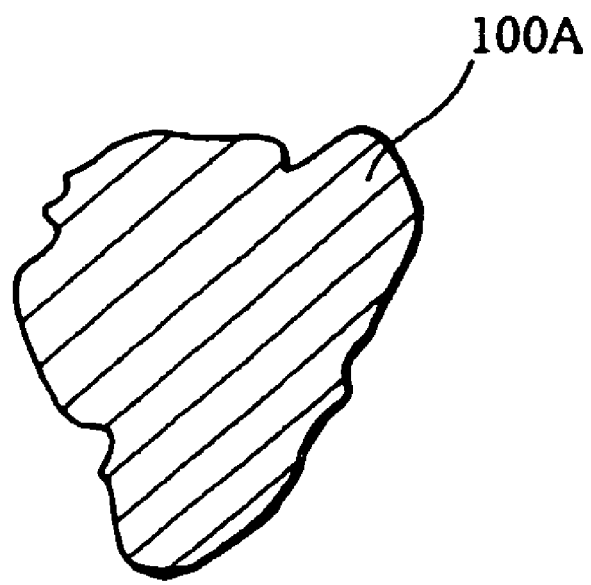
FIGS. 3(a) and 3(b) show results of peeling tests conducted on a sample semiconductor device in accordance with an embodiment of the present invention and a comparison sample.
Figure 3:
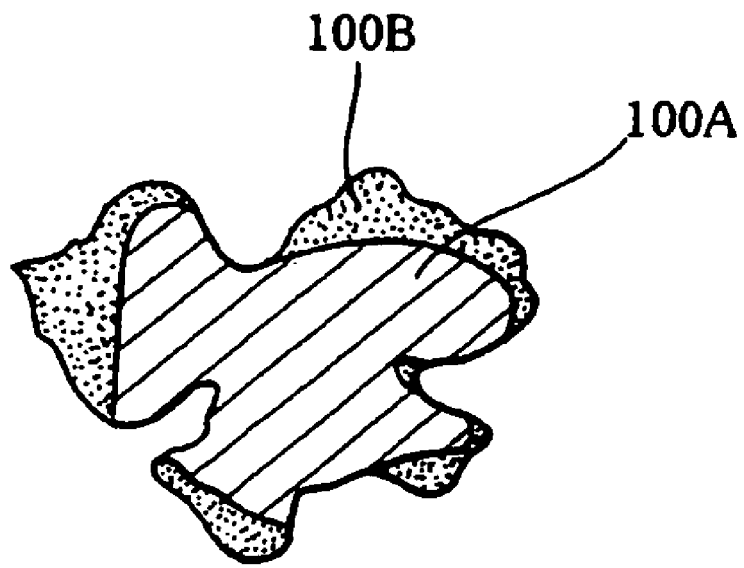
Figure 4:
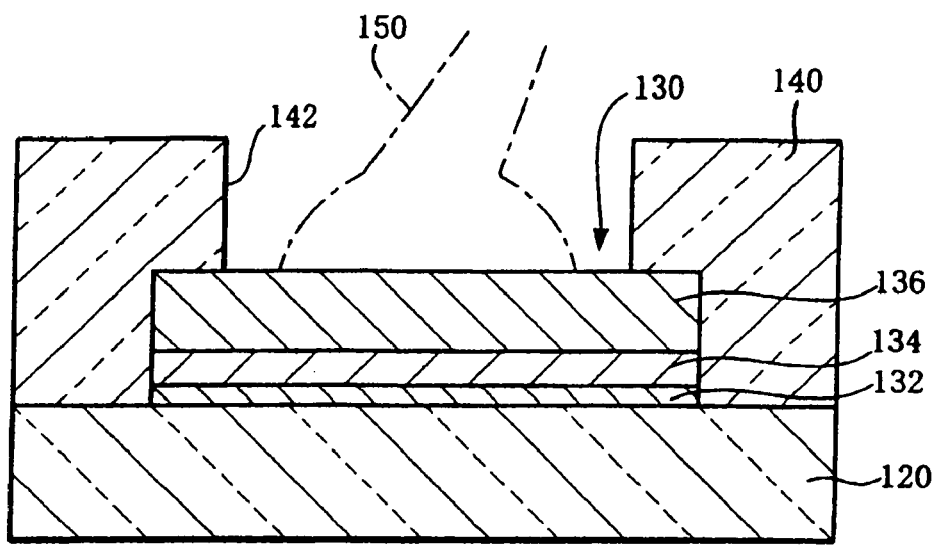
FIG. 4 schematically shows a cross-sectional view of one example of a conventional semiconductor device.

(c) The surfaces of the samples are observed by a microscope to check the peeling conditions of the wetting layers. FIGS. 3(a) and 3(b) show surface conditions of the samples illustrated based on the microscopic photos.

FIG. 3(a) shows the surface condition of the sample of the present embodiment. It is observed from the figure that, although the sample of the present embodiment has a destroyed section 100A caused by the dropped pen, peeling of the wetting layer is not found.

FIG. 3(b) shows the surface condition of the comparison sample. It is observed from the figure that the comparison sample has a destroyed section 100A caused by the dropped pen, and also a peeled section 100B of the wetting layer.

According to the results, it is confirmed that the sample of the present invention having the alloy layer 34 has a greater peeling strength at its pad section compared to the comparison sample that almost does not have an alloy layer 34.

Certain embodiments of the present invention may have the following characteristics.

(a) The metal wiring layer 37 has the alloy layer 34 that contacts the wetting layer 32. The alloy layer 34 is formed from an alloy of a material composing the wetting layer 32 and a material composing the metal layer 36. Due to the presence of the alloy layer 34, the material composing the wetting layer 32 is used for forming the alloy layer 34, and therefore the amount of the material composing the wetting layer 32 that is supplied to the interlayer dielectric layer 20 can be relatively reduced. As a result, this inhibits or prevents the formation of a weak layer of a reaction material generated from the materials composing the wetting layer 32 and the interlayer dielectric layer 20, such as, for example, titanium oxide. In this respect, the coherency of the pad section 30A is improved with respect to the interlayer dielectric layer 20.

(b) The interlayer dielectric layer 20 and the pad section 30A are formed with second layers or above. As a result, a nitride layer having a barrier function (for example, a titanium nitride layer) is not present between the wetting layer and the metal wiring layer. Because the pad section 30A does not have a nitride layer, the reaction between the material composing the wetting layer 32 and the material composing the metal layer 37 is not hindered, and therefore an alloy layer of the both materials (a titanium-aluminum alloy) is readily formed. As a result, the effect (a) described above is more securely achieved.

The present invention is not limited to the embodiments described above, and many modifications can be made within the scope of the subject matter of the present invention.

What is claimed:

1. A semiconductor device, comprising:

a substrate an interlayer dielectric above the substrate;

a wetting layer on the interlayer dielectric layer, the wetting layer including a material that is selected from the group consisting of titanium, cobalt, zirconium, silicon, niobium;

an alloy layer on the wetting layer;

a metal layer on the alloy layer, the metal layer comprising a metal;

wherein the alloy layer comprises the material and the metal; and wherein the alloy layer has a thickness that is two to three times greater than a thickness of the wetting layer.

2. A semiconductor device according to claim 1, wherein the wetting layer includes at least one material selected from the group consisting of cobalt and zirconium.

3. A semiconductor device according to claim 1, including a wiring region and a pad region spaced a distance away from the wiring region, wherein the wiring region and the pad region each comprise a multilayer structure including the wetting layer, the alloy layer and the metal layer.

4. A semiconductor device according to claim 1, further comprising: a pad region including the wetting layer, the alloy layer, and the metal layer; and wherein the pad region does not have a nitride layer between the wetting layer and the metal layer.

5. A semiconductor device including a bonding pad section, comprising:
an interlayer dielectric layer over a substrate;
a bonding pad section including a wetting layer and a metal wiring layer;
the wetting layer being in direct contact with the interlayer dielectric layer and positioned between the interlayer dielectric layer and the metal wiring layer;
the metal wiring layer including an alloy layer and a metal layer, the alloy layer being positioned between the wetting layer and the metal layer;
wherein the wetting layer is formed from a first material, the metal layer is formed from a second material having a different composition than the first material, and the alloy layer comprises the first material and the second material;
the alloy layer having a thickness that is two to three times greater than that of the wetting layer; and
a passivation layer having an opening that exposes an upper portion of the metal layer, the upper portion of the metal layer adapted to receive a bonding wire, wherein the passivation layer is positioned on the metal layer to the sides of the exposed upper portion of the metal layer;
wherein the metal wiring layer is formed from aluminum or an aluminum alloy.

6. A semiconductor device according to claim 5, wherein the pad section does not have a nitride barrier layer between the wetting layer and the metal wiring layer.

7. A semiconductor device according claim 5, wherein the first material comprises a material selected from the group consisting of titanium, cobalt, zirconium, silicon, niobium.

8. A semiconductor device according claim 5, wherein the first material comprises a material selected from the group consisting of cobalt and zirconium.

9. A semiconductor device including a bonding pad section, comprising;
an interlayer dielectric layer over a substrate;
a bonding pad section including a wetting layer and a metal wiring layer,
the wetting layer being in direct contact with the interlayer dielectric layer and positioned between the interlayer dielectric layer and the metal wiring layer;
the metal wiring layer including an alloy layer and a metal layer, the alloy layer being positioned between the wetting layer and the metal layer;
wherein the wetting layer is formed from a first material, the metal layer is formed from a second material having a different composition than the first material, and the alloy layer comprises the first material and the second material;
the alloy layer having a thickness that is two to three times greater than that of the wetting layer; and
a passivation layer having an opening that exposes an upper portion of the metal layer, the upper portion of the metal layer adapted to receive a bonding wire, wherein the passivation layer is positioned on the metal layer to the sides of the exposed upper portion of the metal layer;
wherein the first material is selected from the group consisting of titanium, cobalt, zirconium, silicon, niobium.

10. A semiconductor device according to claim 9, wherein the pad section does not have a nitride barrier layer between the wetting layer and the metal wiring layer.

11. A semiconductor device according to claim 9, wherein the metal wiring layer comprises aluminum.

12. A semiconductor device according claim 9, wherein the first material comprises a material selected from the group consisting of cobalt and zirconium.

13. A semiconductor device comprising:
an interlayer dielectric layer over a substrate;
a wetting layer in direct contact with the interlayer dielectric layer;
a metal wiring layer on the wetting layer, wherein the wetting layer is positioned between the interlayer dielectric layer and the metal wiring layer;
the metal wiring layer including an alloy layer and a metal layer, the alloy layer being positioned between the wetting layer and the metal layer;
a passivation layer having an opening that exposes an upper portion of the metal layer, the opening defining a bonding pad location;
wherein the wetting layer comprises a first material, the metal layer comprises a second material having a different composition than the first material, and the alloy layer comprises the first material and the second material;
the alloy layer having a thickness that is two to three times greater than that of the wetting layer; and
wherein the interlayer dielectric layer extends under the entire bonding pad location.

14. A semiconductor device as in claim 13, wherein the wetting layer is in direct contact with the interlayer dielectric layer under the entire bonding pad location.

15. A semiconductor device according to claim 13, wherein the metal wiring layer is formed from aluminum or an aluminum alloy.

16. A semiconductor device according claim 13, wherein the first material comprises a material selected from the group consisting of titanium, cobalt, zirconium, silicon, niobium.

17. A semiconductor device according claim 13, wherein the first material comprises a material selected from the group consisting of cobalt and zirconium.

* * * * *